United States Patent
Yasumura et al.

(10) Patent No.: US 10,287,704 B2
(45) Date of Patent: May 14, 2019

(54) PROCESS FOR PRODUCING SILICON SINGLE CRYSTAL

(71) Applicant: Tokuyama Corporation, Shunan-shi (JP)

(72) Inventors: Ken Yasumura, Shunan (JP); Shoji Tachibana, Shunan (JP)

(73) Assignee: Tokuyama Corporation, Shunan-shi (JP)

( * ) Notice: Subject to any disclaimer, the term of this patent is extended or adjusted under 35 U.S.C. 154(b) by 0 days.

(21) Appl. No.: 15/506,961

(22) PCT Filed: Aug. 27, 2015

(86) PCT No.: PCT/JP2015/074137
§ 371 (c)(1),
(2) Date: Feb. 27, 2017

(87) PCT Pub. No.: WO2016/031891
PCT Pub. Date: Mar. 3, 2016

(65) Prior Publication Data
US 2017/0283981 A1    Oct. 5, 2017

(30) Foreign Application Priority Data
Aug. 29, 2014   (JP) .................. 2014-174785

(51) Int. Cl.
*C30B 29/06* (2006.01)
*C30B 15/04* (2006.01)
(Continued)

(52) U.S. Cl.
CPC ............. *C30B 15/04* (2013.01); *C30B 15/00* (2013.01); *C30B 15/22* (2013.01); *C30B 25/00* (2013.01);
(Continued)

(58) Field of Classification Search
CPC ......... C30B 29/06; C30B 25/00; C30B 28/14; C01B 33/035; C01B 33/02
See application file for complete search history.

(56) References Cited

U.S. PATENT DOCUMENTS

2002/0081250 A1* 6/2002 Lord ................. B01J 8/003
                                                                422/198
2003/0159647 A1* 8/2003 Arvidson ............. C30B 15/02
                                                                117/30
(Continued)

FOREIGN PATENT DOCUMENTS

CN    101198727 A    6/2008
CN    101203634 A    6/2008
(Continued)

OTHER PUBLICATIONS

European Patent Office, English computer translation of JP2011179840 (2017).*
(Continued)

*Primary Examiner* — Matthew J Song
(74) *Attorney, Agent, or Firm* — The Webb Law Firm (57) ABSTRACT

In a process for producing a silicon single crystal in which carbon is incorporated in order to inhibit crystal defects, provided is a process which easily allows carbon to be mixed and dissolved into a silicon melt. The process for producing a silicon single crystal, which involves allowing a silicon single crystal to grow during its pulling-up from the silicon melt held in a crucible, uses as at least part of a silicon raw material, crushed materials of a polycrystalline silicon rod produced by Siemens process that are obtained by crushing an end of the rod in the vicinity contacting a carbon core wire holding member.

13 Claims, 5 Drawing Sheets

(51) Int. Cl.
*C30B 25/00* (2006.01)
*C30B 15/22* (2006.01)
*C30B 15/00* (2006.01)
*C30B 35/00* (2006.01)
*H01L 31/18* (2006.01)
*C30B 28/14* (2006.01)
*C01B 33/02* (2006.01)
*C01B 33/035* (2006.01)
*H01L 31/028* (2006.01)

(52) U.S. Cl.
CPC ............ *C30B 29/06* (2013.01); *C30B 35/007* (2013.01); *H01L 31/1804* (2013.01); *C01B 33/02* (2013.01); *C01B 33/035* (2013.01); *C30B 28/14* (2013.01); *H01L 31/028* (2013.01); *Y02E 10/547* (2013.01); *Y02P 70/521* (2015.11)

(56) References Cited

U.S. PATENT DOCUMENTS

| | | |
|---|---|---|
| 2005/0045093 A1 | 3/2005 | Watanabe et al. |
| 2006/0283373 A1 | 12/2006 | Inami et al. |
| 2006/0283379 A1 | 12/2006 | Inami et al. |
| 2009/0130333 A1* | 5/2009 | Kim ...................... C01B 33/035 427/545 |
| 2009/0235861 A1 | 9/2009 | Fujiwara et al. |
| 2010/0041215 A1* | 2/2010 | Kim ...................... C01B 33/035 438/488 |
| 2015/0232987 A1* | 8/2015 | Deeg .................... C23C 16/4412 427/255.394 |
| 2016/0045880 A1* | 2/2016 | Miller ................... B01J 8/1872 422/146 |

FOREIGN PATENT DOCUMENTS

| | | | | |
|---|---|---|---|---|
| JP | 11312683 | A | 11/1999 | |
| JP | 2003306321 | A | 10/2003 | |
| JP | 200535802 | A | 2/2005 | |
| JP | 2010180078 | A * | 8/2010 | ........... C01B 33/035 |
| JP | 2011179840 | A * | 9/2011 | ............... G01N 7/00 |
| JP | 2012171822 | A | 9/2012 | |
| JP | 5104437 | B2 | 10/2012 | |
| JP | 201382571 | A | 5/2013 | |
| JP | 201447103 | A | 3/2014 | |

OTHER PUBLICATIONS

European Patent Office, English computer translation of JP2010180078 (2017).*

* cited by examiner

PROCESS FOR PRODUCING SILICON SINGLE CRYSTAL

CROSS-REFERENCE TO RELATED APPLICATIONS

This application is the United States national phase of International Application No. PCT/JP2015/074137 filed Aug. 27, 2015, and claims priority to Japanese Patent Application No. 2014-174785 filed Aug. 29, 2014, the disclosures of which are hereby incorporated in their entirety by reference.

TECHNICAL FIELD

The present invention relates to a process for producing a silicon single crystal from which silicon wafers used as substrates of semiconductor devices such as memory and CPU and solar cell substrates are cut off. In particular, the present invention relates to a method for producing a silicon single crystal into which carbon is incorporated such that BMD, OSF and the like can be controlled for impurity gettering.

BACKGROUND ART

Silicon single crystals fabricated by Czochralski Method (CZ method) contain a crystalline defect, BMD (Bulk Micro Defect). The BMD has a gettering ability that captures contaminant elements such as heavy metals within wafers to enhance properties of substrates. It is known that the BMD in the silicon single crystal goes up by carbon doping at the time of pulling up a silicon single crystal ingot.

The silicon single crystals fabricated by CZ method also contain a crystalline defect, a ring-like OSF (Oxidation induced Stacking Fault). The OSF causes malfunctions in substrates of semiconductor devices, such as increase in leak of electric current, and moreover impairs solar cell properties of solar cell substrates. It is known that the OSF in the silicon single crystals is inhibited by carbon doping at the time of pulling up a silicon single crystal ingot.

It is known that silicon single crystals for the provision of substrates of semiconductor devices and solar cell substrates, if no impurities are contained therein, have a reduced strength and undergo dislocation due to thermal stress in the second half of the pulling-up operation. Approaches to prevent the dislocation from occurring are allowing oxygen to be actively incorporated from a quartz crucible and the doping of impurities such as carbon and nitrogen thereby enhancing the strength of silicon single crystals. In particular, incorporating carbon at a small amount ranging from about 0.01 to 1 ppma (at a state of silicon melt) is effective, because this method would highly increase the strength of silicon single crystals without impairing electric properties of the silicon single crystals. Meanwhile, in solar cell substrates, the demand for reducing the cost of solar photovoltaic generation calls for silicon single crystal producible at a high yield with lower cost.

Recent approach in view of the above is the fabrication of silicon single crystals intentionally doped with carbon. Proposed methods for doping crystals with carbon involve the use of carbon powder (Patent Literature 1) and the use of solid carbon (Patent Literature 2). Those doping methods with the use of solid carbon still have problems such as letting carbon not mixed or dissolved float in a silicon melt thereby making the single crystals remain liable to have dislocations, and the inability to dope carbon at a necessary concentration with favorable precision. Another disadvantage was that as a result of silicon convection with an extremely high concentration of carbon at the bottom of the crucible at an initial stage of the silicon raw material being dissolved within the crucible, the inner wall of the quartz crucible reacts with carbon and this shortens the durability of the quartz crucible.

A method proposed to address the above problems is described in Patent Literature 3. In this document, the inclusion of carbon at a necessary concentration at a favorable precision is done by using, as part of a polycrystalline silicon raw material, a polycrystalline silicon containing carbon at a high concentration of 3 ppma or higher. This method provides the polycrystalline silicon containing carbon at 3 ppma or higher in the form of a thin plate, and subjects this thin plate to acid etching before its use. And yet, no more particular mention is made in this document on the availability of that polycrystalline silicon. The fact is that the attempt to obtain the polycrystalline silicon having a high carbon concentration in the form of a thin plate would require special production process, which will increase the production cost, and involve the concern for possible contamination from other metals than carbon.

Also, the polycrystalline silicon in the shape of the thin plate is inferior in its flowability and in its operability at the time of its introduction into a crucible. Particularly in the production of the silicon single crystals by a process including pulling up a single silicon single crystal, allowing a silicon raw material to be recharged into the crucible and dissolved, and thereafter pulling up a silicon single crystal again, namely a multi-pulling process, the polycrystalline silicon in the shape of the thin plate is inapplicable as the silicon raw material to be recharged, due to its inability to flow downward smoothly within a recharging quartz tube.

Furthermore, the inclusion in the polycrystalline silicon of carbon at a high concentration of 3 ppma or higher can involve the failure for the carbon to be uniformly mixed into the silicon melt thereby localizing the regions with high carbon concentration, possibly causing the single crystals to have dislocation.

CITATION LIST

Patent Literatures

[Patent Literature 1] JP-B-5104437
[Patent Literature 2] JP-A-2012-171822
[Patent Literature 3] JP-A-H11-312683

As in the foregoing, in the process for producing a silicon single crystal in which carbon is incorporated into a silicon single crystal to be pulled up in order to inhibit the dislocation and the reduction in strength, the significant problem to be solved had been to develop a process which easily allows carbon to be mixed and dissolved into a silicon melt and allows the carbon to be incorporated with low cost and which provides excellence in operability in introducing a polycrystalline silicon raw material into a crucible. In particular, the development of the process allowing a necessary concentration of carbon to be mixed and dissolved into the silicon melt with great precision would be beneficial and had been demanded.

SUMMARY OF THE INVENTION

The present inventors have repeated their earnest studies in view of the above problems and have found that in the process for producing the silicon single crystal by CZ method, the above problems can be solved by using, as at least part of a silicon raw material, specific crushed materials derived from a polycrystalline silicon rod produced by Siemens process. The present invention has been made based on the finding.

That is, the present invention, which concerns a process for producing a silicon single crystal involving heating a silicon raw material held in a crucible to provide a silicon melt and allowing a silicon single crystal to grow during the pulling-up of a silicon single crystal ingot from the silicon melt, is characterized by using, as at least part of the silicon raw material, crushed materials of a polycrystalline silicon rod produced by Siemens process, the crushed materials obtained by crushing an end of the rod in the vicinity contacting a carbon core wire holding member.

The process for producing a silicon single crystal of the present invention provides a silicon single crystal ingot into which carbon is incorporated, and therefore, the silicon single crystal ingot has an increased strength with the occurrence of dislocation favorably suppressed. Since the carbon is supplied into the silicon melt while being dissolved in crushed materials of the polycrystalline silicon rod produced by Siemens process that are obtained by crushing an end of the rod in the vicinity contacting a carbon core wire holding member, it is easy for the carbon to be mixed and dissolved, which enables the carbon to be incorporated at a necessary concentration with great precision with low cost. In particular, the use of the crushed materials containing carbon ranging from 0.04 to 2.8 ppma is preferred in terms of fully achieving the effects of increasing the strength and preventing the dislocation in readily providing silicon single crystals containing carbon at a favorable concentration. Furthermore, the use of the crushed materials of the polycrystalline silicon rods produced by Siemens process, which generally have high purity, can give rise to silicon single crystals with less metal contamination.

In addition, the crushed materials, which are shaped as granular pieces, are favorable in their flowability and are excellent in their operability upon being introduced into a crucible. In the production of the silicon single crystal in a multi-pulling mode, the crushed materials, capable of flowing downward smoothly within a recharging quartz tube, are employable favorably as a recharging silicon raw material.

DESCRIPTION OF THE INVENTION

Figure 1:
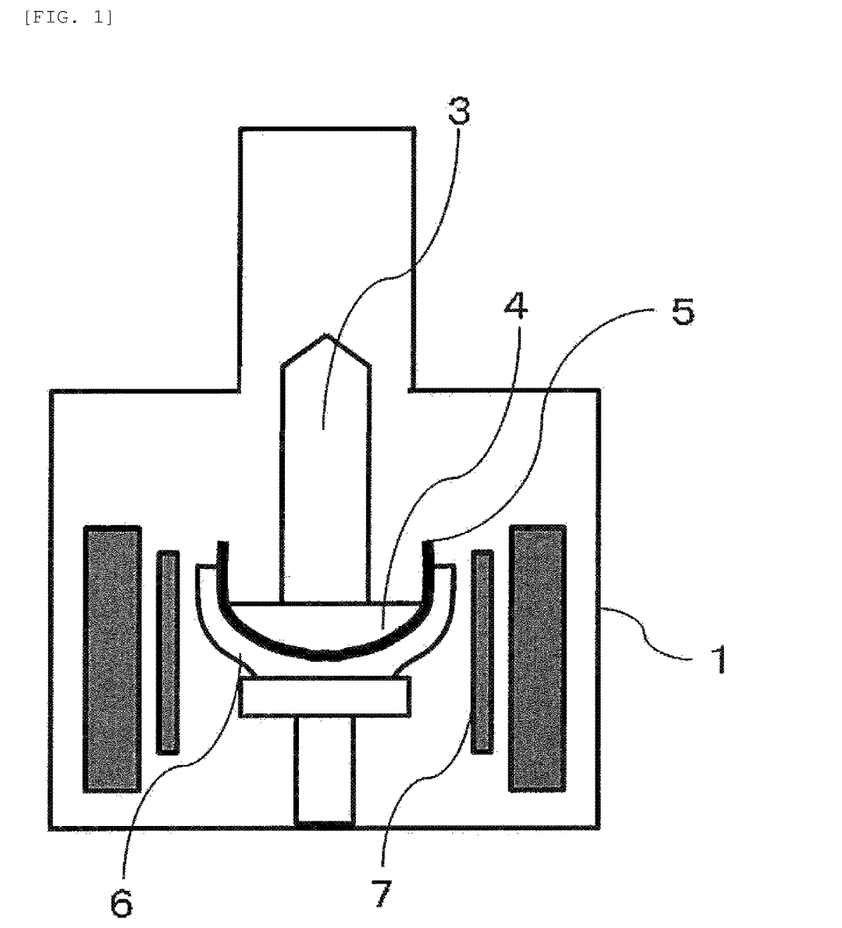
FIG. 1 is a schematic view showing a typical embodiment of a CZ furnace.
Figure 2:
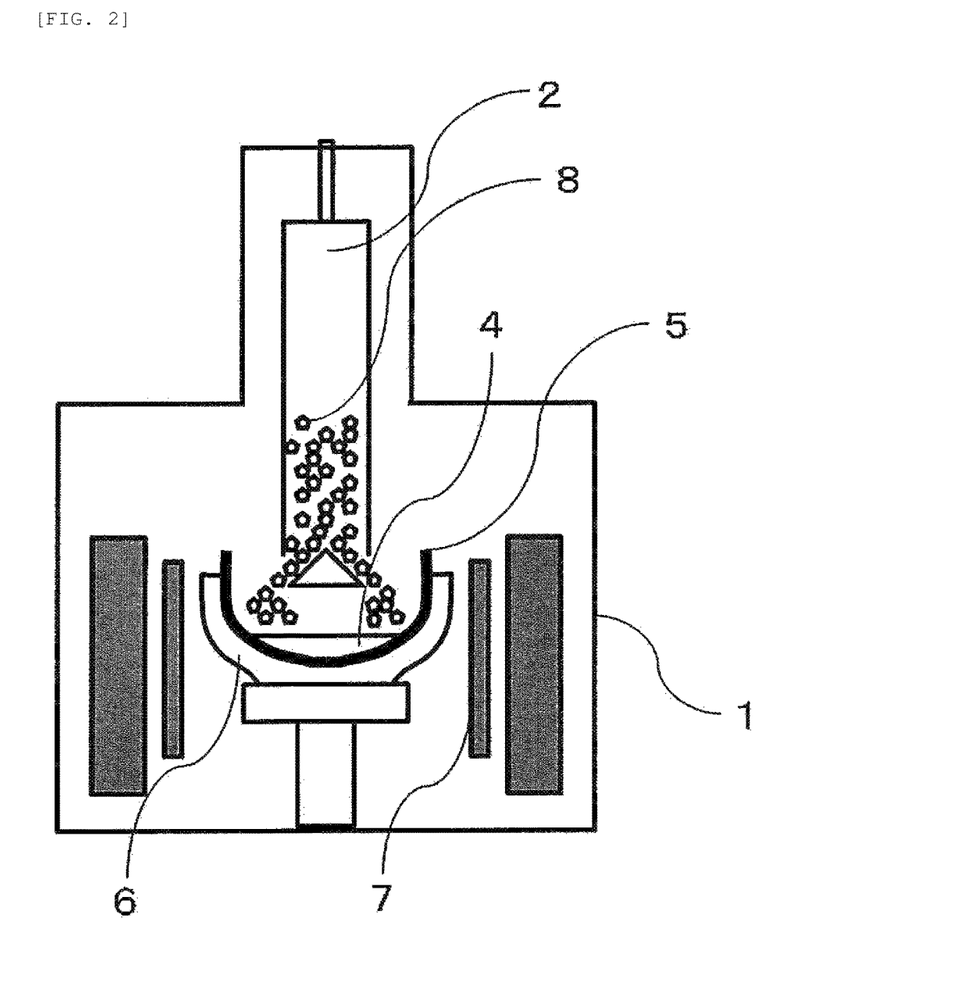
FIG. 2 is a schematic view showing a CZ furnace used in the production of silicon single crystals by CZ method in a multi-pulling mode.

The process for producing a silicon single crystal of the present invention is to be applied to CZ method, i.e., a method including heating a silicon raw material held in a crucible to provide a silicon melt and allowing a silicon single crystal to grow while pulling up a silicon single crystal ingot from the silicon melt. FIG. 1 schematically shows a typical embodiment of a CZ furnace. A main chamber 1 has a quartz crucible 5 for holding a silicon melt 4 and a graphite crucible 6 for supporting the quartz crucible, around which a heater 7 is provided. A silicon raw material, held within the quartz crucible 5, is heated up to its melting point and molten. Into the silicon melt, a seed crystal is immersed. The seed crystal, while being slowly pulled up, is allowed to grow with the temperature of the silicon melt controlled by the heater 7, after which a silicon single crystal ingot 3 having a predetermined size is pulled up. FIG. 2 schematically shows a CZ furnace used in the production of a silicon single crystal by the CZ method in a multi-pulling mode. In this mode, for the pulling-up of the silicon single crystal repeated multiple times, the CZ furnace has, above the quartz crucible 5, a quartz tube 2 for recharging a silicon raw material, through which a recharging silicon raw material 8 is flown downward for its recharge.

The silicon raw material to be held in a crucible in the CZ method is usually polycrystalline silicon. While any types of polycrystalline silicon including those produced by fluidization bed method, metallurgy, zinc reduction method, melt deposition method or other methods are employable, preferred are those produced by Siemens process.

Figure 3:
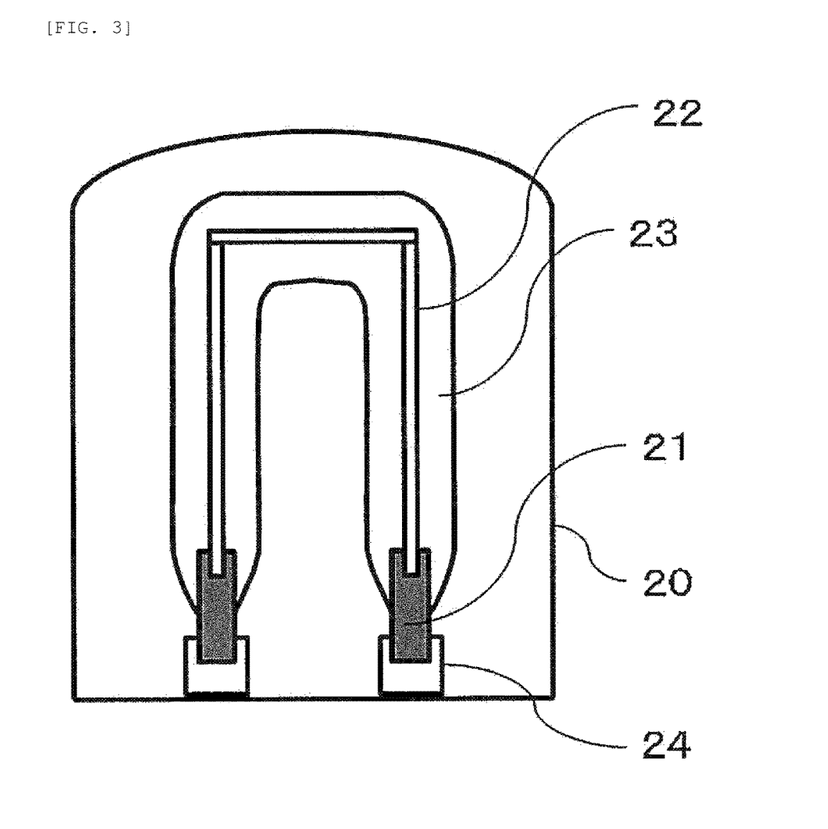
FIG. 3 is a schematic view showing a typical embodiment of a silicon deposition furnace by Siemens process.

Siemens process employs a pair of carbon electrodes each provided with a silicon core wire via a carbon core wire holding member, and while allowing electric current to pass through and heating those members, blows a silane raw material gas, such as trichlorosilane and monosilane, to cause the surface of the silicon core wire to have polycrystalline silicon vapor-grown (deposited) by CVD (Chemical Vapor Deposition) method. FIG. 3 schematically shows a typical embodiment of a silicon deposition furnace 20 based on Siemens process. Specifically, the upper part of a carbon electrode 24 is equipped with a member 21, made of carbon likewise, for holding the silicon core wire (carbon core wire holding member). Into the upper end of the member, a silicon core wire 22 is inserted. Those members, which electric current is passed through and which are heated, undergo the blowing of the silane raw material gas to allow silicon to be deposited, whereby a polycrystalline silicon rod 23 is obtained. At this time, the silicon rod, weighing heavy, is often caused to stand upright without falling down by subjecting a periphery of the carbon core wire holding member 21, too, to the blowing of the raw material gas to allow silicon to be deposited thereon. The polycrystalline silicon produced in this way by Siemens process has high purity, and thus is preferable in giving a silicon single crystal with less metal contamination.

The deposition of the polycrystalline silicon on the surface of the silicon core wire in this way by CVD method provides a polycrystalline silicon rod. The polycrystalline silicon rod is cut off at its both ends from the carbon electrodes, and crushed to be silicon raw materials. The polycrystalline silicon rod is crushed manually with the use of a hammer or mechanically with the use of a crusher such as a jaw crusher. The crushing instrument is preferably made of a material less affected by heavy metals contamination, for example made of tungsten carbide. The crushed materials preferably have a particle size classified such that at least 90% by mass thereof falls within the range from 2 to 100 mm for the length of the long diameter, more preferably such that at least 90% thereof falls within the range from 2 to 50 mm for the length of the long diameter.

In the production of a polycrystalline silicon by Siemens process, the lower end of the carbon electrode 24 is connected at the bottom of the silicon deposition furnace (FIG.

3) with a metal electrode not shown in the drawing, and the upper face of the carbon electrode 24 is provided with the carbon core wire holding member 21. The structure of the member holding the silicon core wire 22 is not particularly limited, but generally the upper end face of the holding member is provided with a holding aperture, and into the holding aperture, an end of the silicon core wire 22 is inserted to support the silicon core wire. The carbon core wire holding member 21 usually has a diameter of 30 to 100 mm and a length of 50 to 200 mm for its body part, and is columnar shaped.

The deposition of the polycrystalline silicon by CVD method is not just on the surface of the silicon core wire but also stretches over the lower region of the silicon core wire to cover the upper outer face of the carbon core wire holding member 21 with the polycrystalline silicon. The carbon core wire holding member 21, at around its base part cutoff from the carbon electrode 24 by being extracted from the carbon electrode 24 in most cases, has been embedded into the central part of the rod at the end of the polycrystalline silicon rod 23.

It is common for the rod end into which the carbon core wire holding member 21 has been embedded to be cut off from the cut-out polycrystalline silicon rod 23 and discarded. In the present invention, in contrast, the rod end is crushed and used as at least part of the silicon raw material in the CZ method. In other words, in the present invention, at least part of the silicon raw material are the crushed materials of the polycrystalline silicon rod produced by Siemens process that are obtained by crushing the rod end in the vicinity contacting the carbon core wire holding member. In detail, since the polycrystalline silicon positioned at the silicon rod end in the vicinity contacting the carbon core wire holding member 21 has a high carbon concentration, using the crushed materials of the polycrystalline silicon rod produced by Siemens process that are obtained by crushing the rod end in the vicinity contacting the carbon core wire holding member (hereinafter also referred to as "the crushed materials in the vicinity of the core wire holding member") as at least part of the silicon raw material in CZ method provides carbon-containing silicon single crystals. The above configuration is not just an effective use of waste materials, but also accomplishes the effects in improving the strength and suppressing the dislocation. According to the above process, carbon, while being dissolved in the crushed materials in the vicinity of the core wire holding member, is introduced into the silicon melt, and therefore is easily mixed and dissolved with uniformity. This favorably leads to significant effects in improving the strength and in suppressing the dislocation. The crushed materials in the vicinity of the core wire holding member, which are shaped as amorphous granular pieces, are good in their flowability and are excellent in their operability upon being introduced into a crucible.

The rod end of the polycrystalline silicon rod produced by Siemens process in the vicinity contacting the carbon core wire holding member, which is in the vicinity of the carbon core wire holding member, represents a region having a high carbon concentration, wherein the carbon concentration is preferably 0.04 ppma or more, more preferably 0.1 ppma or more, and is preferably 2.8 ppma or less, more preferably 2 ppma or less.

That is, the crushed materials of the polycrystalline silicon rod produced by Siemens process that are obtained by crushing the rod end in the vicinity contacting the carbon core wire holding member preferably have a carbon concentration of 0.04 ppma or more, more preferably 0.1 ppma or more, and preferably 2.8 ppma or less or less, more preferably 2 ppma or less.

In the present invention, the carbon concentration at the rod end in the vicinity contacting the carbon core wire holding member is a value measured by secondary ion mass spectrometry (SIMS).

The crushed materials of the polycrystalline silicon rod produced by Siemens process that are obtained by crushing the rod end in the vicinity contacting the carbon core wire holding member have a particle size such that at least 90% by mass thereof preferably has a length of a long diameter which is 2 to 100 mm, and further at least 90% by mass thereof preferably has a length of a long diameter which is 2 to 50 mm. The particle size of the crushed materials is preferably within the above range for 90 to 100% by mass of the crushed materials, more preferably within the above range for 95 to 100% by mass of the crushed materials, and most preferably within the above range for 100% by mass of the crushed materials.

In order for the silicon single crystal produced by the production process of the present invention to fully exhibit the reduced dislocation effect, the substantial whole region of the straight body part of the silicon single crystal ingot preferably has a carbon concentration of 0.01 to 1 ppma, more preferably 0.025 to 0.9 ppma. To provide the silicon single crystal ingot with such a carbon concentration, it is preferred to use, as at least part of the silicon raw material, the crushed materials in the vicinity of the core wire holding member. The substantial whole region of the straight body part of the silicon single crystal ingot as used herein refers to an at least 90% of the region covering from the starting position to the lower end in the direction of the length of the straight body part. The carbon concentration of the silicon single crystal ingot is a concentration of a substitutional carbon measured with a Fourier transform infrared spectrophotometer (FT-IR). Measured values of the carbon concentration at center positions in the straight body part are defined as carbon concentration values at the heights of the straight body part.

In the production process of the present invention, at least part of the silicon raw material are the crushed materials in the vicinity of the core wire holding member, wherein the crushed materials in the vicinity of the core wire holding member may constitute the whole of the silicon raw material or may constitute part of the silicon raw material. In the production process of the present invention, the crushed materials in the vicinity of the core wire holding member preferably occupy 20 to 100% by mass, more preferably occupy 50 to 100% by mass in 100% by mass of the silicon raw material. The use of the crushed materials in the vicinity of the core wire holding member in the above range is preferable in terms of easily enabling the carbon concentration of the resultant silicon single crystal ingot to fall within the above range.

When part of the silicon raw material are the crushed materials in the vicinity of the core wire holding member, other silicon raw materials than the crushed materials in the vicinity of the core wire holding member are not particularly limited, and may be silicon raw materials conventionally used in the production of silicon single crystals by CZ method with no particular restriction. Those other silicon raw materials than the crushed materials in the vicinity of the core wire holding member are preferably crushed materials of the straight body part of polycrystalline silicon rods produced by Siemens process. Those other silicon raw materials than the crushed materials in the vicinity of the core wire holding member preferably have a low carbon concentration, the concentration being preferably 0.02 ppma or less. Those other silicon raw materials than the crushed materials in the vicinity of the core wire holding member usually have a carbon concentration of 0.005 ppma or more.

The crushed materials of the straight body part of polycrystalline silicon rods produced by Siemens process have a carbon concentration significantly lower than 0.04 ppma, which is a preferred carbon concentration of the polycrystalline silicon rods in the vicinity of the core wire holding member. Such a lower concentration is too small to be easily measurable with SIMS. In this case, a method for measurement of carbon concentration described in ASTM F1723-02 ("Standard Practice for Evaluation of Polycrystalline Silicon Rods by Float-Zone Crystal Growth and Spectroscopy") can be adopted. Specifically, a straight body part of a silicon rod is cored to give a sample bar with a diameter of 2 cm horizontally running through the center of the straight body part, and the cored sample bar is subjected to etching, and the sample bar whose surface has been washed is used to produce a single crystal silicon by floating zone method (FZ method), and a bulk carbon concentration of that single crystal silicon is measured with a Fourier transform infrared spectrophotometer (FT-IR). The crushed materials of the straight body part of the polycrystalline silicon rod have a carbon concentration as measured by the above method which is usually 0.02 ppma or less, preferably 0.01 ppma or less.

Figure 4:
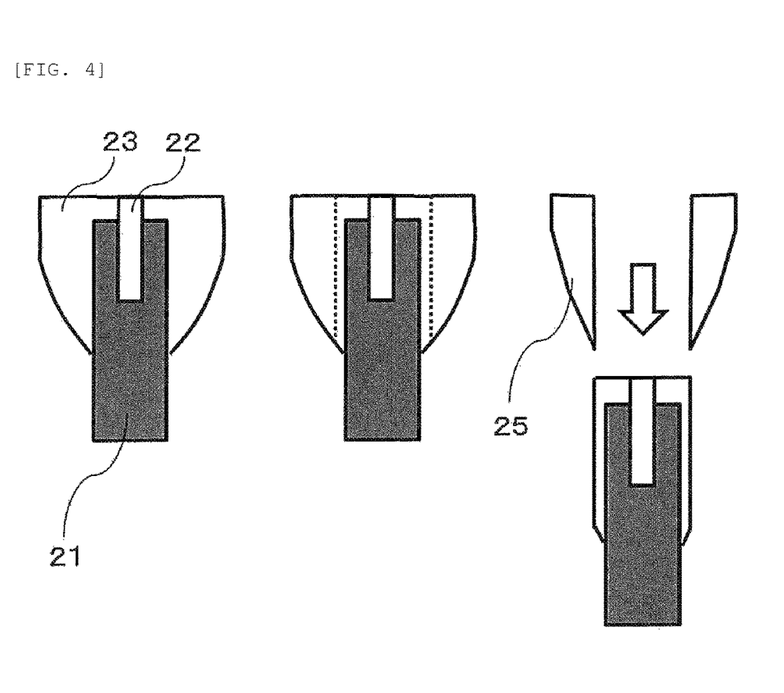
FIG. 4 is a schematic view showing the removal of a core including a carbon core wire holding member embedded into a rod end cut off from a polycrystalline silicon rod.

In the present invention, the crushed materials of the polycrystalline silicon rod produced by Siemens process that are obtained by crushing the rod end in the vicinity contacting the carbon core wire holding member are obtainable by any manner which is not particularly limited. A method preferred, as shown in FIG. 4, is that from a rod end cut off from the polycrystalline silicon rod, a core including both the carbon core wire holding member embedded into the rod end and the polycrystalline silicon surrounding the carbon core wire holding member is removed to give a rod end hollow body 25, and the rod end hollow body is crushed. The rod end hollow body, which is hollow, is preferable in being crushable more easily than solid rods.

According to the knowledge of the present inventors, the carbon concentration of the polycrystalline silicon in the vicinity of the core wire holding member is extremely high at the surface contacting the carbon core wire holding member, and is reduced in proportion to the increase of the distance therefrom in the radial direction and in the upward direction. This is believed to be related to the mechanism that the carbon from the carbon core wire holding member, as the result of its reaction with the silane raw material gas, is partly gasified, which is then incorporated to allow silicon to be deposited, and thus the farther distance from the carbon core wire holding member means the less amount of the carbon to be incorporated into the polycrystalline silicon. The carbon concentration distributions that are approximate to one another are reproducible at ends of all the polycrystalline silicon rods produced in the same silicon deposition furnace under the same deposition conditions and moreover at ends of all the polycrystalline silicon rods obtained through the above production repeated. The dispersion of the carbon concentration distributions at the rod ends of the polycrystalline silicon rods, as measured at the same positions, usually falls within the range different by ±10% from average values thereof.

Figure 5:
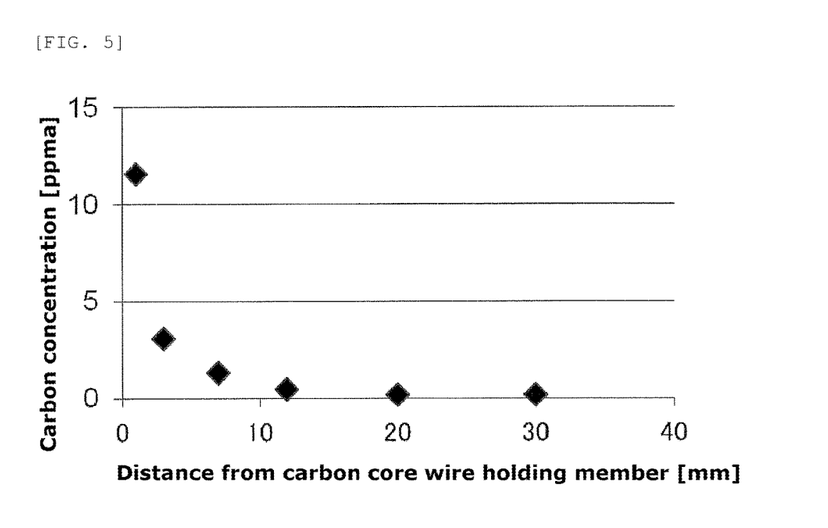
FIG. 5 is a graph showing a carbon concentration distribution at a rod end of a polycrystalline silicon rod obtained in Example 1.

Thus, the carbon concentration of the crushed materials in the vicinity of the core wire holding member that are used as the silicon raw material can be adjusted, at the time of removing the core including the carbon core wire holding member from the cut-off rod end, by varying the diameter of the core including the carbon core wire holding member to be removed. Specifically, the carbon concentration of the silicon single crystal can be increased by employing a coring drill with a small diameter and removing the core at a position close to the carbon core wire holding member in the rod end, whereas the carbon concentration of the silicon single crystal can be decreased by employing a coring drill with a large diameter and removing the core at a position a little far from the carbon core wire holding member in the rod end. It is preferred for the crushed materials in the vicinity of the core wire holding member prepared in the above way to be composed primarily (95% by mass or more) of the crushed materials having a carbon concentration of 0.04 to 2.8 ppma, and more preferred for the crushed materials in the vicinity of the core wire holding member to be composed primarily of the crushed materials having a carbon concentration of 0.1 to 2 ppma. The carbon amount of the crushed materials of the rod end obtained by the coring is the total amount in the regions to be used in the carbon concentration distribution of the rod end in the vicinity of the core wire holding member as shown in FIG. 5 provided later.

As described above, the carbon concentration at the rod end, which is lowered at positions farther from the carbon core wire holding member, is lowest at the periphery of the rod, which in some cases contains carbon below the necessary concentration. Since the inclusion of a large amount of crushed materials with such a lower carbon concentration would reduce the efficiency of controlling the carbon concentration of the silicon single crystal, the rod periphery may be removed by the removal of a larger-diameter core than the diameter of the core including the carbon core wire holding member to be removed.

In view of the knowledge as described in the foregoing that the carbon concentration distribution values that are approximate to one another are reproducible at the ends of the polycrystalline silicon rods manufactured with the same silicon deposition furnace under the same deposition conditions, it is particularly efficient in the present invention to produce the silicon single crystal in the following manner. The process preferred comprises: measuring a carbon concentration distribution at the rod end of the polycrystalline silicon rod produced by Siemens process in the vicinity contacting with the carbon core wire holding member; varying a diameter of a core to be removed, based on the measured carbon concentration distribution, in the production by the above-mentioned process of crushed materials in the vicinity of the core wire holding member from another polycrystalline silicon rod produced in the same silicon deposition furnace and under the same deposition conditions as the above polycrystalline silicon rod; and using the crushed materials thus obtained with their carbon concentration adjusted as at least part of the silicon raw material. The carbon concentration of the resultant silicon single crystal is such that the carbon concentration at the substantial whole region of the straight body part of the silicon single crystal ingot is preferably 0.01 to 1 ppma, more preferably 0.025 to 0.9 ppma.

Particularly in the above process, the crushed materials in the vicinity of the core wire holding member with their carbon concentration adjusted are preferably used as a recharging silicon raw material in the production of a silicon single crystal by way of multi-pulling. That is, the crushed materials in the vicinity of the core wire holding member, which are in the form of granular pieces, are good in their flowability and are excellent in their operability upon being introduced into a crucible. The use of such crushed materials as the recharging silicon raw material in the production of the silicon single crystal by the multi-pulling is preferable in enabling the crushed materials to smoothly flow downward within the recharging quartz tube as well as in easily allowing the pulled-up silicon rods to have a constant carbon concentration.

In detail, in multi-pulling, due to the concentration of carbon into the silicon melt by the influence of segregation coefficient at the time of silicon solidification, the carbon concentration in a silicon raw material to be recharged needs to vary according to a carbon concentration required in a silicon single crystal. The use of the crushed materials in the vicinity of the core wire holding member with their carbon concentration believed to be easily adjustable under the above-described assumption easily enables the carbon concentration in the silicon melt to be kept at a constant level, achieving the above-described effect. Also, in multi-pulling, where a high concentration of carbon is already present in the melt, carbon to be additionally introduced needs to be less in its amount as compared with the pulling-up of a single rod. This need is met by the crushed materials in the vicinity of the core wire holding member, which have a moderate carbon concentration ranging from about 0.04 to 2.8 ppma, and is thus favorable in the introduction of a small amount of carbon with great precision.

The polycrystalline silicon in the polycrystalline silicon rod end in the vicinity of the interface with the carbon core wire holding member sometimes contains SiC. The use of such a polycrystalline silicon as the silicon raw material easily causes dislocation in the resultant silicon single crystal. To minimize the influence of SiC, it is preferred to use a polycrystalline silicon positioned far at a distance of 1 mm or more from the interface with the carbon core wire holding member, particularly far at a distance of 3 mm or more from the interface with the carbon core wire holding member.

The silicon single crystals obtained by the production process of the present invention are applicable as raw materials of silicon wafers used for substrates of semiconductor devices, solar cell substrates and others with no restriction, and are more preferably silicon single crystals for solar cell substrates, which are more preferred carbon-containing embodiments.

EXAMPLES

The present invention will be described with reference to examples in greater detail hereinbelow, but the present invention is not limited by those examples.

In Examples and Comparative Examples, various properties were measured in the following manners.

1) Method for Measuring Carbon Concentration Distribution at Polycrystalline Silicon Rod End In a rod end that had been cut off from a polycrystalline silicon rod, a disk-shaped polycrystalline silicon thin plate with a thickness of 2 mm in the horizontal direction was cut out at a position 10 mm below the upper end of a carbon core wire holding member that had been embedded into the rod end. In the polycrystalline silicon thin plate, 5 mm-square samples for measurement centered on positions far radially at a distance of 3 mm, 7 mm, 12 mm, 20 mm and 30 mm from its surface contacting the carbon core wire holding member were cut out.

Those samples for measurement (5 mm-square×2 mmt), after their surfaces were mirror polished, were subjected to measurement of carbon concentrations at positions far radially from the surface contacting the carbon core wire holding member by secondary ion mass spectrometry (SIMS). With regard to the sample for measurement cut at the position far at a distance of 3 mm, both a carbon concentration at the position far at a distance of 3 mm from the surface contacting the carbon core wire holding member and a carbon concentration at a position far at a distance of 1 mm therefrom were measured.

2) Method for Measuring Carbon Concentration at Silicon Single Crystal Ingot Pulled Up The straight body part of a silicon single crystal ingot that had been pulled up was cut at the starting position and at the lower end of the straight body part horizontally at a thickness of 2.5 mm, to give respective disk-shaped polycrystalline silicon thin plates. From the central positions of the polycrystalline silicon thin plates obtained, 15 mm-square samples were cut out, whose surfaces were then mirror polished, and subjected to measurement of concentrations of substitutional carbon with a Fourier transform infrared spectrophotometer (FT-IR).

3) Methods for Studying Dislocation in Silicon Single Crystal Pulled Up

During the pulling-up of a single crystal, the presence of crystal habit line at the periphery of the single crystal was visually observed through an inspection hole of a CZ furnace. Specifically, during the observation of crystal habit line appearing on the surface of the silicon single crystal, disappearance of the crystal habit line was regarded as the occurrence of dislocation.

Example 1

A CZ furnace having a structure shown in FIG. 1 and equipped with a quartz crucible with a diameter of 22 inches (56 cm) was used. In the quartz crucible, 120 kg of crushed materials in the vicinity of a core wire holding member was held, and a silicon single crystal ingot with its straight body part having a diameter of 8 inches (20.3 cm) was pulled up. The pulling-up of the ingot was performed such that the carbon concentration in the single crystal at the starting position of the straight body part was 0.025 ppma. In view of the segregation coefficient of carbon being 0.07, the carbon concentration at the time of starting the pulling-up of the straight body part was achieved by adjusting the carbon concentration of the silicon melt to be 0.35 ppma.

A silicon raw material used in the above was crushed materials in the vicinity of the core wire holding member produced by the following method. Specifically, a silicon deposition furnace having a basic structure shown in FIG. 3 and having multiple pairs of carbon electrodes to which silicon core wire was attached was used to perform deposition by Siemens process to give polycrystalline silicon rods. One of those polycrystalline silicon rods was cut off at around the base of the carbon core wire holding member. The other rod end was horizontally cut off at a position 10 mm above the upper end of the carbon core wire holding member from the body part of the rod. The above operation provided a rod end having a diameter of 110 mm and a length of 70 mm wherein the carbon core wire holding member (diameter: 50 mm, length of embedded rod: 60 mm) had been embedded through the lower end.

Carbon concentration distribution in the polycrystalline silicon of the above rod end that surrounded the carbon core wire holding member was measured by the above-mentioned method, and results thereof are shown in Table 1.

TABLE 1

| Distance from surface contacting carbon core wire holding member mm | Carbon concentration ppma |
|---|---|
| 1 | 11.58 |
| 3 | 3.12 |
| 7 | 1.31 |
| 12 | 0.49 |
| 20 | 0.18 |
| 30 | 0.18 |

The carbon concentration was highest at around the surface contacting the carbon core wire holding member (position far at a distance of 1 mm), and became lowered as the distance from that position increased. A carbon concentration distribution shown in FIG. 5 was given.

Meanwhile, from two polycrystalline silicon rods positioned at other pairs of carbon electrodes produced with the above deposition furnace, rod ends were cut out similarly (those three rods subjected to the measurement had grown at the region in the vicinity of the outer wall of the furnace, at the region in the vicinity of the center of the furnace, and at the region in the vicinity of the middle in the radial direction in the furnace), and carbon concentration distribution in the polycrystalline silicon in those two polycrystalline silicon rods was measured by the above method. As a result, the difference in carbon concentration distribution was small enough that the carbon concentration values measured at those distances from the surface contacting the carbon core wire holding member was in the range different by ±10% from average values for those three rods. Furthermore, from three polycrystalline silicon rods selected likewise from the multiple polycrystalline silicon rods obtained through the production repeated under the same conditions, rod ends were cut out, and carbon concentration distribution in the polycrystalline silicon in those rod ends was measured. As a result, carbon concentration values measured obtained for the new three rods, too, were in the range different by ±10% from average values determined from the measurement results for the new three rods combined with the measurement results for the previous three rods.

Measurement of carbon concentration distribution performed at positions 30 mm below the upper end of the rod end found that difference in the measured values was also small enough that those measured values were in the range different by ±10% from the values set forth in Table 1.

From the measurement results shown in Table 1, an approximate curve was determined. Totaling the carbon concentration distribution in the radial direction enables the relation between carbon concentration and mass to be determined. Based thereon, a position at which the rod end should be cored so as to provide a silicon raw material with the desired carbon concentration was determined. It was found consequently that the removal of the core including the carbon core wire holding member from the rod end with the use of a coring drill with an outer diameter of 64 mm was necessary in order to allow the resultant rod end hollow body to contain 0.35 ppma of carbon in its entirety.

Based thereon, the operation of obtaining the rod end hollow body from the polycrystalline silicon rod produced with the use of the same silicon deposition furnace under the same deposition conditions as described above was repeated. Subsequently, the resultant rod end hollow bodies each having an inner diameter of 64 mm and an outer diameter of 110 mm were crushed so as to cause the length of the long diameter to be in the range from 2 to 50 mm by using a tungsten carbide hammer. As a result, crushed materials in the vicinity of the silicon core wire holding member were obtained. It was estimated that if those crushed materials in the vicinity of the core wire holding member were held in the quartz crucible and dissolved in the silicon melt, the silicon melt would have a carbon concentration totaling to be 0.35 ppma.

120 kg of the above crushed materials in the vicinity of the core wire holding member was held in the quartz crucible, and a silicon single crystal ingot was pulled up by CZ method. The pulling-up was achieved without dislocation. In the resultant silicon single crystal ingot, carbon concentrations at the starting position of its straight body part and at the lower end of its straight body part (solidification degree: 0.9) were measured to be 0.025 ppma and 0.21 ppma, respectively.

Example 2

A silicon single crystal ingot was pulled up in the same manner as in Example 1 except that a carbon concentration in the single crystal at the starting position of the straight body part was 0.1 ppma. In view of the segregation coefficient of carbon being 0.07, the carbon concentration at the time of starting the pulling-up of the straight body part was achieved by adjusting the carbon concentration of the silicon melt to be 1.4 ppma.

A silicon raw material used in the above was crushed materials in the vicinity of the core wire holding member produced by the following method. First, a rod end cut out from a polycrystalline silicon rod, after its periphery was removed by using a coring drill having an inner diameter of 74 mm, was subjected to the removal of the core including the carbon core wire holding member by using a coring drill having an outer diameter of 56 mm. The above operation gave a rod end hollow body having an inner diameter of 56 mm and an outer diameter of 74 mm. The rod end hollow body was crushed. It was estimated that if those crushed materials in the vicinity of the core wire holding member were held in the quartz crucible and dissolved in the silicon melt, in view of the carbon concentration distribution determined in the foregoing, the silicon melt would have a carbon concentration totaling to be 1.4 ppma.

Those crushed materials in the vicinity of the core wire holding member were held in the quartz crucible, and a silicon single crystal was pulled up by CZ method. The pulling-up was achieved without dislocation. Carbon concentrations at the starting position of the straight body part and at the lower end of the straight body part were measured to be 0.10 ppma and 0.83 ppma, respectively.

Subsequently, to 12 kg of the silicon melt remaining in the quartz crucible, 108 kg of a new silicon raw material for the second silicon single crystal by multi-pulling was introduced. The second silicon single crystal ingot was pulled up in the same manner as in the pulling-up of the first silicon single crystal such that a carbon concentration in the single crystal at the starting position of the straight body part was 0.1 ppma. For this to occur, it was necessary for 120 kg of the silicon melt after the recharging to have a carbon concentration adjusted to be 1.4 ppma. The carbon concentration of the 12 kg of silicon melt remaining in the quartz crucible was calculated to be 11.9 ppma in view of the segregation coefficient, and therefore the 108 kg of crushed materials in the vicinity of the core wire holding member to be newly introduced needed to have a carbon concentration of 0.24 ppma.

In the same manner as in Example 1, the rod end was subjected to the removal of the core including the carbon core wire holding member by using a coring drill with an outer diameter of 74 mm. The rod end hollow body thus obtained having an inner diameter of 74 mm and an outer diameter of 110 mm was crushed so as to cause the length of the long diameter to be in the range from 2 to 50 mm by using a tungsten carbide hammer. As a result, the crushed materials in the vicinity of the core wire holding member for recharging were obtained, and held into a recharging quartz tube 2 detached from the CZ furnace. With the bottom cover of the recharging quartz tube slowly opened to create a gap, through which the crushed materials in the vicinity of the core wire holding member for recharging were introduced into the quartz crucible. Thereby, the 108 kg of silicon raw material was introduced.

A silicon single crystal ingot was pulled up by CZ method. The pulling-up was achieved without dislocation. In the resultant second silicon single crystal ingot, carbon concentrations at the starting position of its straight body part and at the lower end of its straight body part were measured to be 0.10 ppma and 0.84 ppma, respectively.

In the same manner as in the second pulling-up, third, fourth and fifth pulling-up were performed. Results thereof are shown in Table 2.

TABLE 2

| | | Carbon concentration at starting position of straight body part ppma | Carbon concentration at lower end of straight body part ppma | Dislocation Number of times |
|---|---|---|---|---|
| Example 2 | First | 0.10 | 0.83 | 0 |
| | Second | 0.10 | 0.84 | 0 |
| | Third | 0.10 | 0.84 | 1 |
| | Fourth | 0.10 | 0.85 | 1 |
| | Fifth | 0.10 | 0.85 | 0 |

Example 3

The same operation as in Example 1 was performed except that the silicon single crystal ingot was pulled up such that a carbon concentration in the single crystal at the starting position of the straight body part was 0.025 ppma. In view of the segregation coefficient of carbon being 0.07, the carbon concentration at the time of starting the pulling-up of the straight body part was achieved by adjusting the carbon concentration of the silicon melt to be 0.35 ppma.

A silicon raw material used in the above was crushed materials from the vicinity of the electrode produced by the following method. First, a rod end cut out from a polycrystalline silicon rod was subjected to the removal of the core including the carbon core wire holding member by using a coring drill having an outer diameter of 58 mm. As a result, a rod end hollow body having an inner diameter of 58 mm was obtained. The rod end hollow body was crushed. The crushed materials in the vicinity of the electrode were calculated to have a carbon concentration of 0.43 ppma in its entirety in view of the carbon concentration distribution determined above. To 96 kg of the crushed materials in the vicinity of the electrode, 24 kg of crushed materials of the straight body part of a polycrystalline silicon rod obtained by Siemens process which had a carbon concentration as measured in accordance with ASTM F1723-02 of 0.01 ppma, was mixed to give 120 kg of a silicon raw material for the pulling-up of the silicon single crystal ingot. It was estimated that if 120 kg of the silicon raw material was held in a quartz crucible and dissolved in a silicon melt, the silicon melt would have a carbon concentration totaling to be 0.35 ppma.

The raw material mixture was held in the quartz crucible, and a silicon single crystal was pulled up by CZ method. The pulling-up was achieved without dislocation. Carbon concentrations at the starting position of the straight body part and at the lower end of the straight body part (solidification degree: 0.9) were measured to be 0.025 ppma and 0.21 ppma, respectively.

Example 4

The same operation as in Example 2 was performed except that the silicon single crystal ingot was pulled up such that a carbon concentration in the single crystal at the starting position of the straight body part was 0.1 ppma. In view of the segregation coefficient of carbon being 0.07, the carbon concentration at the time of starting the pulling-up of the straight body part was achieved by adjusting the carbon concentration of a silicon melt to be 1.4 ppma.

The first silicon single crystal by multi-pulling was performed in the same manner as in Example 2.

A silicon raw material used for the second silicon single crystal by multi-pulling was a mixture obtained by mixing 59 kg of crushed materials in the vicinity of the electrode obtained by the same manner as in Example 3 which had a carbon concentration calculated to be 0.43 ppma in its entirety with 49 kg of crushed materials of the straight body part of a polycrystalline silicon rod obtained by Siemens process which had a carbon concentration as measured in accordance with ASTM F1723-02 of 0.01 ppma. It was estimated that if 108 kg of that silicon raw material was held in the quartz crucible, and dissolved in the silicon melt, the silicon melt would have a carbon concentration totaling to be 0.24 ppma.

The raw material mixture was held into a recharging quartz tube 2 detached from the CZ furnace. With the bottom cover of the recharging quartz tube slowly opened to create a gap, through which the crushed materials from the vicinity of the electrode for recharging were introduced into the quartz crucible. Thereby, 108 kg of the silicon raw material was introduced.

After the second pulling-up, third, fourth and fifth pulling-up were performed in the same manner as in the second pulling-up. Results thereof are shown in Table 3.

TABLE 3

| | | Carbon concentration at starting position of straight body part ppma | Carbon concentration at lower end of straight body part ppma | Dislocation Number of times |
|---|---|---|---|---|
| Example 4 | First | 0.10 | 0.85 | 0 |
| | Second | 0.10 | 0.84 | 0 |
| | Third | 0.10 | 0.86 | 0 |
| | Fourth | 0.10 | 0.85 | 1 |
| | Fifth | 0.10 | 0.83 | 1 |

Comparative Example 1

The production of a silicon single crystal ingot was performed in the same manner as in the pulling-up of the first silicon single crystal ingot in Example 2, except that 120 kg of the silicon raw material to be held in the quartz tube was changed from the crushed materials in the vicinity of the core wire holding member to a mixture obtained by mixing 96.0 kg of crushed materials of a high-purity polycrystalline silicon obtained by Siemens process which had a carbon concentration as measured by SIMS that was lower than the detectable lower limit (length of long diameter in the range from 2 to 50 mm) with 24.0 kg of crushed materials of a polycrystalline silicon having a high carbon concentration as measured by SIMS of 7.0 ppma (length of long diameter in the range from 2 to 50 mm).

The polycrystalline silicon crushed materials having a high carbon concentration as the latter-mentioned silicon raw material was produced by a complicated method as follows: in the production of a silicon single crystal ingot by CZ method, a carbon piece was introduced into a high-purity silicon raw material; the carbon concentration within a melt was kept so as to exceed the solid solubility limit of carbon; and therefrom an ingot was pulled up, and the straight body part of the resultant ingot was crushed. The carbon concentration as high as 7.0 ppma of the polycrystalline silicon crushed materials having a high carbon concentration was considerably higher than the normal carbon concentration (normally ranging from 0.04 to 2.8 ppma) of the crushed materials in the vicinity of the core wire holding member as used in Examples 1 and 2 (crushed materials of the polycrystalline silicon rod produced by Siemens process that were obtained by crushing the rod end in the vicinity contacting the carbon core wire holding member).

The use of such a silicon raw material, however, resulted in the occurrence of dislocation six times during the pulling-up, and was accompanied by repeated need to cause the ingot being pulled up to be dissolved and perform pulling-up operations, which would be because of the failure for carbon to be uniformly mixed into the melt and uneven distribution of high carbon concentration regions thereby reducing the durability of the quartz crucible. In the resultant silicon single crystal ingot, carbon concentrations at the starting position of its straight body part and at the lower end of its straight body part (solidification degree: 0.9) were measured to be 0.10 ppma and 0.83 ppma, respectively.

Comparative Example 2

In the pulling-up of the first silicon single crystal ingot in Example 2, 120 kg of the silicon raw material to be held in the quartz tube was changed from the crushed materials in the vicinity of the core wire holding member to 120 kg of crushed materials of a high-purity polycrystalline silicon obtained by Siemens process which had a carbon concentration as measured by SIMS that was lower than the detectable lower limit (length of long diameter in the range from 2 to 50 mm). Meanwhile, as a carbon doping source, 0.072 g of carbon granule obtained by crushing a molding agent to a size of 1 to 3 mm was put in a container, and extruded into the main chamber of the CZ furnace, and left to stand in the atmosphere of 500° C. for 3 hours.

With the container being rotated, the carbon granule was introduced into the crucible a little while before the high-purity polycrystalline silicon crushed materials held in the quartz crucible became completely molten during its melting step. After the passage of 180 minutes, a silicon single crystal started to be pulled up. The above operation, however, resulted in the occurrence of dislocation two times during the pulling-up, and was accompanied by repeated need to cause the ingot being pulled up to be dissolved and perform pulling-up operations, which would be because of the failure for the carbon granule to be uniformly mixed sufficiently into the silicon melt. In the resultant silicon single crystal ingot, carbon concentrations at the starting position of its straight body part and at the lower end of its straight body part (solidification degree: 0.9) were measured to be 0.08 ppma and 0.63 ppma, respectively.

LIST OF REFERENCE SIGNS

1. Main chamber
2. Recharging quartz tube
3. Silicon single crystal ingot
4. Silicon melt
5. Quartz crucible
6. Graphite crucible
7. Heater
8. Recharging silicon raw material
20. Silicon deposition furnace
21. Carbon core wire holding member
22. Silicon core wire
23. Polycrystalline silicon rod
24. Carbon electrode
25. Rod end hollow body

The invention claimed is:

1. A process for producing a silicon single crystal by heating a silicon raw material held in a crucible to provide a silicon melt and allowing a silicon single crystal to grow during the pulling-up of a silicon single crystal ingot from the silicon melt, the process comprising using, as at least part of the silicon raw material, crushed materials of a polycrystalline silicon rod produced by Siemens process, the crushed materials obtained by crushing an end of the rod in the vicinity contacting a carbon core wire holding member,
    wherein a carbon concentration of the crushed materials is from 0.04 to 2.8 ppma,
    wherein the crushed materials are obtained by removing a core including both the carbon core wire holding member embedded into the rod end and a polycrystalline silicon surrounding the carbon core wire holding member and covering a distance of 3 mm or more from an interface of the polycrystalline silicon with the carbon core wire holding member from the rod end cut off from the polycrystalline silicon rod to give a rod end hollow body, and thereafter crushing the rod end hollow body,
    wherein the polycrystalline silicon is in direct contact with a surface of the carbon core wire holding member, and
    wherein carbon from the carbon core wire holding member is incorporated into the polycrystalline silicon while silicon is being deposited.

2. The process for producing a silicon single crystal according to claim 1, wherein a substantial whole region of a straight body party of the silicon single crystal ingot has a carbon concentration of 0.01 to 1 ppma.

3. The process for producing a silicon single crystal according to claim 2, wherein the crushed materials have a particle size such that at least 90% by mass of the crushed materials fall within the range from 2 to 50 mm for a length of a long diameter.

4. The process for producing a silicon single crystal according to claim 3, which provides a silicon single crystal for producing a substrate of a solar cell.

5. The process for producing a silicon single crystal according to claim 2, which provides a silicon single crystal for producing a substrate of a solar cell.

6. The process for producing a silicon single crystal according to claim 1, wherein the crushed materials have a particle size such that at least 90% by mass of the crushed materials fall within the range from 2 to 50 mm for a length of a long diameter.

7. The process for producing a silicon single crystal according to claim 6, which provides a silicon single crystal for producing a substrate of a solar cell.

8. The process for producing a silicon single crystal according to claim 1, comprising:
measuring a carbon concentration distribution at the rod end of the polycrystalline silicon rod produced by Siemens process in the vicinity contacting with the carbon core wire holding member,
varying a diameter of a core to be removed, based on the measured carbon concentration distribution, in the production by the process according to claim 1 of crushed materials in the vicinity of the core wire holding member from another polycrystalline silicon rod produced in the same silicon deposition furnace and under the same deposition conditions as the polycrystalline silicon rod, and
using the crushed materials thus obtained with a carbon concentration adjusted as at least part of the silicon raw material.

9. The process for producing a silicon single crystal according to claim 8, wherein the silicon single crystal is produced by multi-pulling, and the crushed materials in the vicinity of the core wire holding member with a carbon concentration adjusted are used as a recharging silicon raw material in the multi-pulling.

10. The process for producing a silicon single crystal according to claim 9, which provides a silicon single crystal for producing a substrate of a solar cell.

11. The process for producing a silicon single crystal according to claim 8, which provides a silicon single crystal for producing a substrate of a solar cell.

12. The process for producing a silicon single crystal according to claim 1, which provides a silicon single crystal for producing a substrate of a solar cell.

13. The process for producing a silicon single crystal according to claim 1, wherein a substantial whole region of a straight body party of the silicon single crystal ingot has a carbon concentration of 0.025 to 0.9 ppma.

* * * * *